United States Patent [19]

Murray et al.

[11] Patent Number: 4,887,040
[45] Date of Patent: Dec. 12, 1989

[54] DEVICE FOR MEASURING THE IMPEDANCE OF A MEDIUM ALONG A MEASUREMENT LINE

[75] Inventors: Charles N. Murray, Ispra, Italy; Thomas R. Fortescue, Bridport, United Kingdom

[73] Assignee: Europaische Atomgemeinschaft (EURATOM), Luxembourg

[21] Appl. No.: 305,593

[22] Filed: Feb. 3, 1989

[30] Foreign Application Priority Data

Feb. 3, 1988 [LU] Luxembourg ............................ 87124

[51] Int. Cl.$^4$ ..................... G01N 27/02; G01N 27/07; G01R 27/14
[52] U.S. Cl. .................................... 324/446; 324/65 P
[58] Field of Search ............... 324/446, 448, 449, 65 P

[56] References Cited

U.S. PATENT DOCUMENTS

| B 465,393 | 1/1976 | Kirklen et al. | 324/62 |
| 3,906,353 | 9/1975 | Murdock . | |
| 4,010,715 | 3/1977 | Robar et al. | 119/14.14 |
| 4,644,263 | 2/1987 | Johnson | 324/65 P |

FOREIGN PATENT DOCUMENTS 2337338  7/1977  France .

Primary Examiner—Reinhard J. Eisenzopf
Assistant Examiner—Anthony L. Miele
Attorney, Agent, or Firm—Sughrue, Mion, Zinn, Macpeak & Seas

[57] ABSTRACT

The invention relates to a device for measuring the impedance of a medium along a measurement line, the medium being either sea water or a sediment on the sea-bottom or else a mixture thereof. According to the invention, a special antenna (2) is used, which extends along the measurement line and contains a succession of ring electrodes (10, 11), which can selectively be fitted into a meter circuit (FIG. 2) via cyclically switched Reed relays (34, 35). The invention can especially be applied to the study of the alterations of a hole in a sediment at sea-bottom created behind a torpedo-shaped container penetrating by gravity into the sediment.

2 Claims, 2 Drawing Sheets

DEVICE FOR MEASURING THE IMPEDANCE OF A MEDIUM ALONG A MEASUREMENT LINE

FIELD OF THE INVENTION

The invention refers to a device for measuring the impedance of a medium along a measurement line, the medium being either sea water or a sediment on the sea-bottom or else a mixture thereof.

BACKGROUND OF THE INVENTION

Recently, the sea-bottom has become of interest to scientists, to ore searchers and for waste storage purposes. In the latter case, waste must be sealed in torpedo-shaped containers, which are then dropped in suitable places to the sea-bottom. The weight and the shape of the containers are chosen such that high terminal velocities and consequently a considerable depth of container penetration into the sea-bottom sediment at a water depth of up to 5 or 6 kilometers are achieved.

It is fundamental for this concept that the hole created by the penetration of the container into the sediment fills up again behind the container and contributes to the sealing of the container. This requirement is absolutely necessary, as, over a period of several hundred years, the container will inevitably leak. If this happens, no material must be washed out of the container and reach the surface of the sediment. The closing of this hole is thus of essential importance for this kind of studies.

The filling-up of the hole depends on the geotechnical data of the sea-bottom, especially of the sediment layer into which the container penetrates.

Due to the water depth of up to 6000 meters, the penetration of the container into the sediment layer can hardly be directly observed by an underwater camera. In any case, such an underwater camera would only show the situation at the surface of the sediment but not in the body of the sediment. Also a test boring in the hole area after the penetration of the container would not supply reliable results, as one cannot be sure that the test boring has been made along the hole axis. This applies in particular as one cannot be quite sure whether the container has penetrated exactly vertically into the sediment. It is thus necessary the fix a measurment device at the rear end of the container, which measures certain physical characteristics of the hole area. This device must run along the hole through which the container has penetrated into the sediment layer and must transmit the impedance data through an antenna via acoustic signals to a receiver at the water surface.

SUMMARY OF THE INVENTION

It is thus the aim of the invention to provide a device for the measurement of certain physical data of the medium above the container, this medium being either sea water or a sediment or a mixture of both.

According to the invention, the device contains an antenna extending along the measurement line, an electric signal generator feeding said antenna and a meter circuit for measuring the antenna impedance, the antenna consisting of a central core, a plurality of electric wires wound around the core, an insulating layer surrounding these wires and a series of electrically conducting braid sections of limited length, which are disposed around this insulating layer and arranged one after the other in regular length portions, each even-numbered braid portion being connected to one of the wires respectively, whereas all odd-numbered braid sections are connected in common to another one of these wires, the generator and the meter circuit being associated to a programmable multiplex switch which is able to cyclically establish feed and meter circuits between any two wires associated to the even-numbered braid portions, whereas the odd-numbered braid portions are permanently grounded via said common wire.

In a preferred embodiment of the invention, the antenna is attached to a torpedo-like container, which is to penetrate by gravity into the sediment at sea-bottom; in this case, the generator, the meter circuit and the multiplex switch are disposed inside the container, whereas the free end of the antenna is supplied with a float body. An acoustic transmitter is also located in the container.

DETAILED DESCRIPTION OF THE INVENTION

The invention will now be described in more detail by means of a preferred embodiment and the attached drawings.

Figure 1:
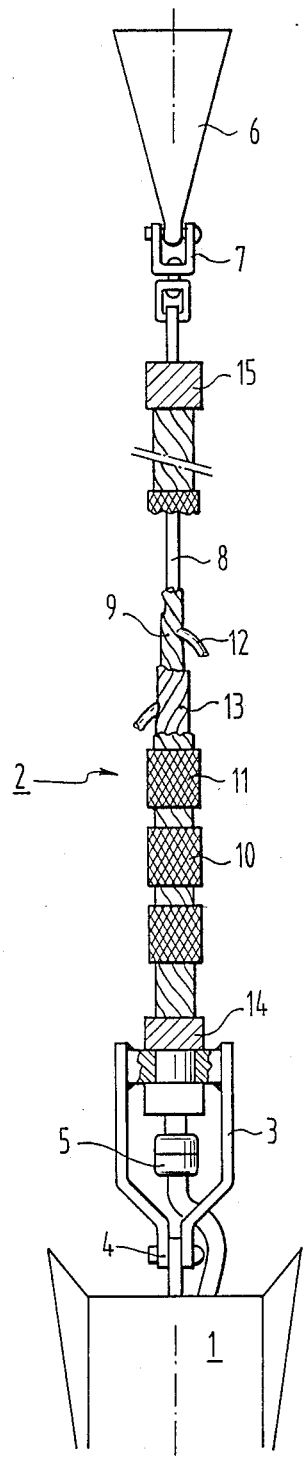
FIG. 1 shows schematically an antenna for the device according to the invention.

FIG. 1 shows the upper part of a torpedo-shaped container 1, which is mechanically coupled to an antenna 2 via a bracket 3 and a bolt 4. The electric connection is made through a water-proof multiple connector 5.

The upper end of the antenna 2 is coupled to a float body 6 via a swivel shackel 7, which allows a free relative rotation between float body 6 and antenna 2. The float body is intended to remain above the sediment layer. It consists of a metal foam and has an essentially conical form with a largest diameter of about 200 mm and a length of 1.3 m.

The antenna is composed of several superimposed layers, which have been taken off increasingly from the bottom to the top, so that the structure can clearly be seen.

The antenna 2 has a central core 8 of circular cross-section with a diameter of about 7.9 mm. This core must be able to withstand all traction forces which might occur. Fourteen insulated electric wires 9 are helically wound around this core. The antenna is composed of 25 length portions, which have each one electrode, for example 10 or 11. These portions can be divided up into even-numbered and odd-numbered portions, the odd-numbered portions constituting guard electrodes for reducing edge effects which might falsify the measurement results.

Each of the twelve even-numbered portions is associated to an individual one of the wires 9, and the end of this wire is cut and insulated at the level of the corresponding portion. A further wire, or, for reliability reasons, two wires in parallel, is connected to all odd-numbered electrodes.

In FIG. 1, only the core 8 is seen in the upper antenna part. It is followed by a part in which the fourteen wires 9 are seen, which are wound around the core. In this part, a bare end 12 of such a wire is seen, which is to be connected to the electrode of the corresponding portion. The next following part shows the antenna after the next procedure step of its manufacturing, according to which an insulating tape is wound around the set of wires 9 in an overlapping fashion. The free ends of the wires which are to contact the different electrodes pass through this layer 13 of insulating tape. The lowest part of the antenna shows the electrodes 10 and 11 which are constituted by braids of aluminum wires. These braids are soldered to the associated wire ends 12. The axial length of the electrodes may for example be 1430 mm, and the gaps between two neighbouring electrodes about 10 mm.

If variable diameters along the length, due to the number of wires increasing towards the bottom, are to be avoided, dummies of similar diameter may be inserted in the layer of wires downstream of the respective wire ends like 12. Finally, the multiple connector 5 is connected to the lower ends of the wires 9, and both ends of the antenna 2 are supplied with a moulded end fitting 14 and 15 respectively, to which the float body 6 and the container 1 respectively can be coupled.

Now, the measurement principle will be explained with reference to FIG. 2. In this figure, the electrodes are symbolically represented by plates. As mentioned above, the odd-numbered electrodes 11, 11', 11'' act as guard electrodes and are all connected to a ground line 16, whereas the impedance measurement of the medium surrounding the electrodes is carried out by using respectively two neighbouring even-numbered electrodes like for example the electrodes 10, 10'. To this end, one of these even-numbered electrodes, which then acts as feed electrode, is connected to an AC generator 17, while the neighbouring even-numbered electrode 10', which then acts as measuring electrode, is connected to a current meter 18. The impedance of the medium surrounding the antenna 12 to be measured is symbolically represented by a resistor 19. Parasitic impedances in the direction of the guard electrodes are symbolized by resistors 19a and 19b.

In order to minimize as far as possible the reactances due to the capacities between the electrode and the sea water which would be in series with the resistances to be measured, it is advantageous to choose the operating frequency as high as possible. However, the skin effect and the requirement for a high quality inductor reduce the maximum frequency to values below 100 kHz.

Preferably, an AC generator of the constant voltage type is used, as the parasitic impedances are parallel to the resistor 19 to be measured and thus do not impair the measurement in the current meter 18.

Figure 3:
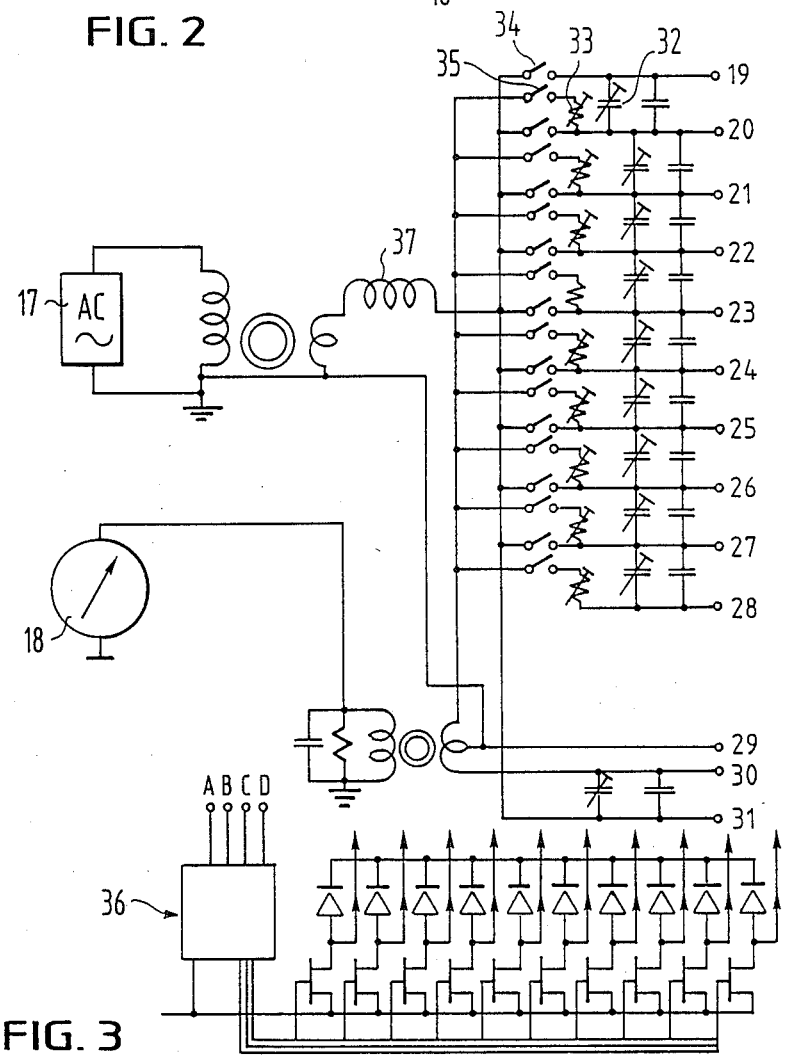
FIG. 3 shows schematically an AC generator, a meter circuit and a multiplex switch, which are associated to the antenna and located inside the container.

FIG. 3 schematically shows the AC generator 17, the current meter 18 and switch means, the latter allowing to cyclically connect the generator and the meter to any desired pair of neighbouring even-numbered electrodes. The assembly shown in FIG. 3 is disposed inside the container 1 (FIG. 1) and connected to the antenna via the mulitple connector 5. The different contact pins of this connector are shown in FIG. 3 on the right side and carry reference numerals 19 to 31. The pins 19 to 28 are connected to the even-numbered electrodes like for example 10, 10', whereas the pin 29 acting as ground contact is connected to all odd-numbered electrodes 11, 11'; two further pins 30 and 31 are permanently connected to the two even-numbered electrodes nearest to the float body 6, which electrodes are assumed to remain in any case above the sediment in the water and thus serve as reference or comparison elements. The capacitance between feed electrode and guard electrode of the antenna is brought into resonance with an inductance 37. In this way, the measured impedance becomes purely ohmic. Trimming capacitors and trimming resistors 32 and 33 are further included to compensate for asymmetries between the different pairs of electrodes.

Figure 2:
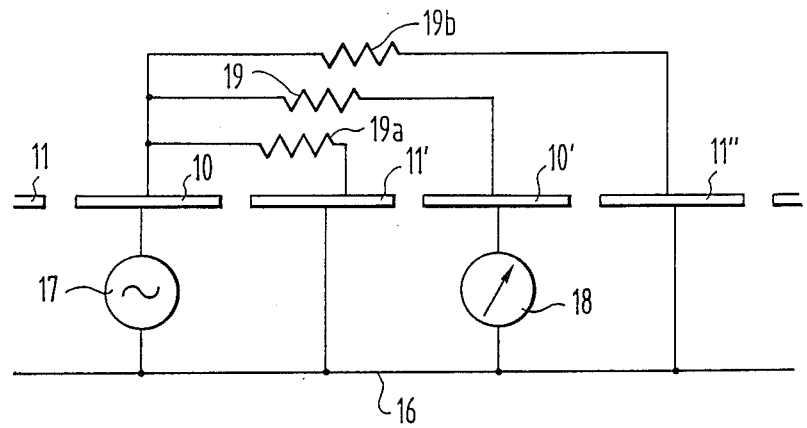
FIG. 2 shows the impedance measuring principle, on which this antenna relies.

Two switches are simultaneously closed for establishing a circuit according to FIG. 2. These switches are Reed relays. Their programmable control is carried out in a control unit, which is seen in the lower part of FIG. 3 and which carries the reference numeral 36. This control unit works cyclically, so that the meter 18 measures successively for all even-numbered electrode pairs the difference between the current flowing in the selected measurement electrode due to the selected feed electrode, and the current flowing from the electrode 30 to the electrode 31 (the reference current in sea water above the sediment). The impedance values can be deduced therefrom. These results are stored in a storage device (not shown) and, if desired, transmitted to the water surface via an acoustic transmitter (not shown).

It might be desirable to include into the antenna 2 itself small step-down transformers between each wire 9 and the corresponding electrode 10, 11 at the level of the wire end 12. A step-down ratio of 7:1 leads to an impedance transformation ratio of 49:1, so that the 0.2 sea water resistance is transformed to an equivalent load resistance of not quite 10. An auto-transformer consisting of 42 turns tapped at six turns leads to a primary inductance of about 1.2 mH and is on the other side still small enough to be integrated into the antenna cable without great difficulty. It may further be advantageous, if galvanic, electrolytic and surface contamination effects are to be taken into account, to protect the electrodes of the antenna against sea water via an insulating tape wound around the electrodes. However, this leads to parasitic impedances of about 400 pF in series with each electrode and requires a complex conjugate matching of the oscillating circuits.

We claim:

1. A device for measuring the impedance of a medium along a measurement line, the medium being either sea water or a sediment on the sea-bottom or else a mixture thereof, the device comprising an antenna extending along the measurement line, an electric signal generator feeding said antenna and a meter circuit for measuring the antenna impedance, the antenna consisting of a central core, a plurality of electric wires wound around the core, an insulating layer surrounding said electric wires and a series of electrically conducting even and odd numbered braid sections of limited length, which are disposed around this insulating layer and arranged one after the other in regular length portions, each even-numbered braid section being connected to one of the wires respectively, whereas all odd-numbered braid sections are connected in common to a common wire, the generator and the meter circuit being connected to a programmable mulitplex switch which is able to cyclically connect the generator and the meter circuit to any two wires connected to the even-numbered braid portions, whereas the odd-numbered braid portions are permanently grounded via said common wire.

2. A device according to claim 1, wherein the antenna is connected to a torpedo-like container, which is to penetrate into the sediment at sea-bottom by gravity, and the generator, the meter circuit and the multiplex switch are disposed inside the container, whereas the free end of the antenna is supplied with a float body.

* * * * *